(12) United States Patent
Okuyama et al.

(10) Patent No.: US 6,868,030 B2
(45) Date of Patent: Mar. 15, 2005

(54) SEMICONDUCTOR MEMORY APPARATUS SIMULTANEOUSLY ACCESSIBLE VIA MULTI-PORTS

(75) Inventors: Yoshiaki Okuyama, Kawasaki (JP); Shinya Fujioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 108 days.

(21) Appl. No.: 10/345,373

(22) Filed: Jan. 16, 2003

(65) Prior Publication Data

US 2003/0193832 A1 Oct. 16, 2003

(30) Foreign Application Priority Data

Apr. 12, 2002 (JP) .................................... 2002-110275

(51) Int. Cl.[7] .............................................. G11C 8/00
(52) U.S. Cl. ........................... 365/230.03; 365/230.06; 365/63; 365/230.01
(58) Field of Search ...................... 365/230.03, 230.06, 365/63, 230.01

(56) References Cited

U.S. PATENT DOCUMENTS 6,041,388 A * 3/2000 Anumula et al. ........... 711/100
6,421,294 B2 * 7/2002 Hidaka .................. 365/230.03
6,438,667 B1 * 8/2002 Shinozaki ................... 711/163

FOREIGN PATENT DOCUMENTS

JP 2001-43674 2/2001

* cited by examiner

*Primary Examiner*—Michael S. Lebentritt
*Assistant Examiner*—N Nguyen
(74) *Attorney, Agent, or Firm*—Arent Fox, PLLC

(57) ABSTRACT

A dual-port semiconductor memory apparatus constructed by a core circuit and a plurality of ports, different row blocks of which in the same column block of the core circuit are simultaneously accessible. Since each of the ports is provided with a global data bus, different row blocks of the same column block can be accessed via both ports by selectively activating a column line corresponding to a port and another column line corresponding to another port.

7 Claims, 6 Drawing Sheets

SEMICONDUCTOR MEMORY APPARATUS SIMULTANEOUSLY ACCESSIBLE VIA MULTI-PORTS

BACKGROUND OF THE INVENTION

1. Field of the Invention

The present invention generally relates to a semiconductor memory apparatus, and particularly, to a dual-port type semiconductor memory apparatus.

2. Description of the Related Art

A conventional dynamic random access memory (DRAM) is constructed with a memory core circuit including a memory cell array that is divided into a plurality of row blocks and a plurality of column blocks, and in which a memory block is provided at each intersection of a row block and a column block. A plurality of memory blocks in each row block share the same word line, and a plurality of memory blocks in each column block share the same column line.

When the core circuit thus constructed is being accessed for reading or writing, data stored in memory blocks in a row block having a common word line can be accessed continuously. Data stored in memory blocks in another row block, however, are not accessible unless the access to the currently accessed row block is completed.

By the way, a dual-port type semiconductor memory apparatus having two input and output (I/O) ports is provided with two series of control pins, address pins, and DQ pins. A core circuit of such a dual-port type semiconductor memory apparatus is accessed through the two I/O ports independently.

In the case where the dual-port type semiconductor memory apparatus of a conventional technique is simultaneously accessed from external devices through both I/O ports and the core circuit responds to an access through one of the I/O ports, the dual-port type semiconductor memory apparatus is required to keep the external device making the other access through the other I/O port waiting by outputting to the external device, if the external device is requesting for an access to read data, a signal indicating the core circuit is busy, or requesting, if the external device is requesting for an access to write data, the external device to make the request again later.

As described above, while the core circuit is busy processing an access through one of the I/O ports, another access to the core circuit through the other I/O port is rejected with a probability of 100%. A dual-port type semiconductor memory apparatus of such a conventional technique is disclosed in the Japanese Laid-open Patent Application No. 2001-43674. The dual-port type semiconductor memory apparatus described in this specification cannot accept simultaneous accesses to the same column block. An external device is required to wait until a prior access to the core circuit is completed.

SUMMARY OF THE INVENTION

Accordingly, it is a general object of the present invention to provide a novel and useful semiconductor memory apparatus in which one or more of the problems described above are eliminated.

Another and more specific object of the present invention is to provide a multi-port DRAM constructed by a DRAM core circuit and a plurality of ports, different row blocks of which in the same column block are simultaneously accessible.

To achieve one of the above objects, a semiconductor memory apparatus according to the present invention includes a first I/O port and a second I/O port, a cell array circuit divided into a plurality of column blocks and a plurality of row blocks, a first column line and a second column line corresponding to said first I/O port and said second I/O port, respectively, a first global data bus and a second global data bus corresponding to said first I/O port and said second I/O port, respectively, said first global data bus and said second global data bus being provided to each one of the plurality of column blocks, a first bus connection gate circuit that connects a sense amp of one of the plurality of row blocks selected in response to an access through said first I/O port, said sense amp being selected by said first column line, to said first global data bus, and a second bus connection gate circuit that connects a sense amp of one of the plurality of row blocks selected in response to an access through said second I/O port, said sense amp being selected by said second column line, to said second global data bus.

In the case where the present invention is implemented as a dual-port (hereinafter referred to as a left port and a right port) semiconductor memory apparatus, each of the left port and the right port is provided with a global data bus. Accordingly, different row blocks of the same column block can be accessed via the left port and the right port by selectively activating a column line corresponding to the left port and another column line corresponding to the right port. For example, in a reading operation, it is possible to read data from a row block to the global data bus corresponding to the left port by selectively activating the column line corresponding to the left port, and at the same time, to read data from another row block to the global data bus corresponding to the right port by selectively activating the column line corresponding to the right port.

Compared with a semiconductor memory apparatus of the conventional technique, a semiconductor memory apparatus according to the present invention can substantially reduce the probability in which, while its core circuit is accessed via a port, another access to the core circuit via another port is rejected. Particularly, unless the addresses designating row blocks match, the core circuit is independently accessible via different ports.

Other objects, features, and advantages of the present invention will become more apparent from the following detailed description when read in conjunction with the accompanying drawings.

DETAILED DESCRIPTION OF THE PREFERRED EMBODIMENTS

A detailed description of an embodiment of the present invention will be given below.

Figure 1:
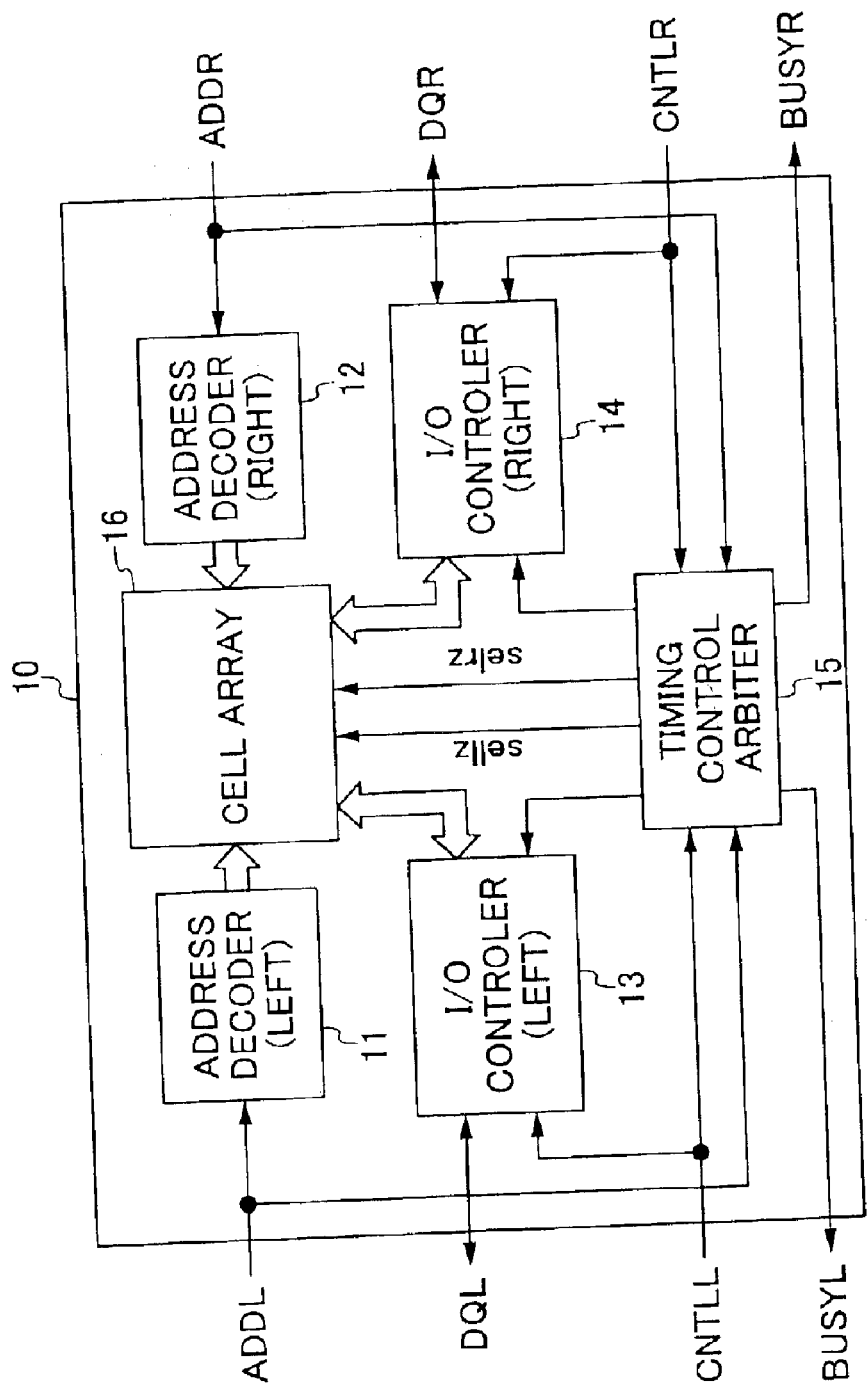
FIG. 1 is a block diagram showing the construction of a dual-port type semiconductor memory apparatus according to an embodiment of the present invention.

FIG. 1 is a block diagram showing the construction of a dual-port memory according to an embodiment of the present invention.

The dual-port memory 10 of FIG. 1 includes an address decoder 11 for the left port, an address decoder 12 for the right port, an input and output (I/O) controller circuit 13 for the left port, an I/O port 14 for the right port, a timing control arbiter 15, and a cell array circuit 16. The dual-port memory 10 is provided with address pins $ADD_L$, data I/O pins $DQ_L$, control signal pins $CNTL_L$, and a busy output pin $BUSY_L$ for the left port, and address pins $ADD_R$, data I/O pins $DQ_R$, control signal pins $CNTL_R$, and a busy output pin $BUSY_R$ for the right port. Commands such as a read command READ, a write command WRITE, a stand-by command STANDBY are transferred as control signals. The cell array circuit 16 of the dual-port memory 10 is accessible through the left port and the right port independently.

The address decoders 11 and 12 decode addresses input through a corresponding port and select designated addresses in the cell array circuit 16. The I/O control circuits 13 and 14 are controlled by the timing control arbiter 15 based on an external command and exchange data with an exterior through a corresponding port.

The timing control arbiter 15 receives an external command and determines the timing of each portion of the dual-port memory 10. Further, the timing control arbiter 15 determines the order of inputting commands input through the left port and the right port, and determines whether the addresses input through the left port and the right port match. If the addresses match, the timing control arbiter 15 outputs a busy signal through the port through which the command is input later than the other.

Figure 2:
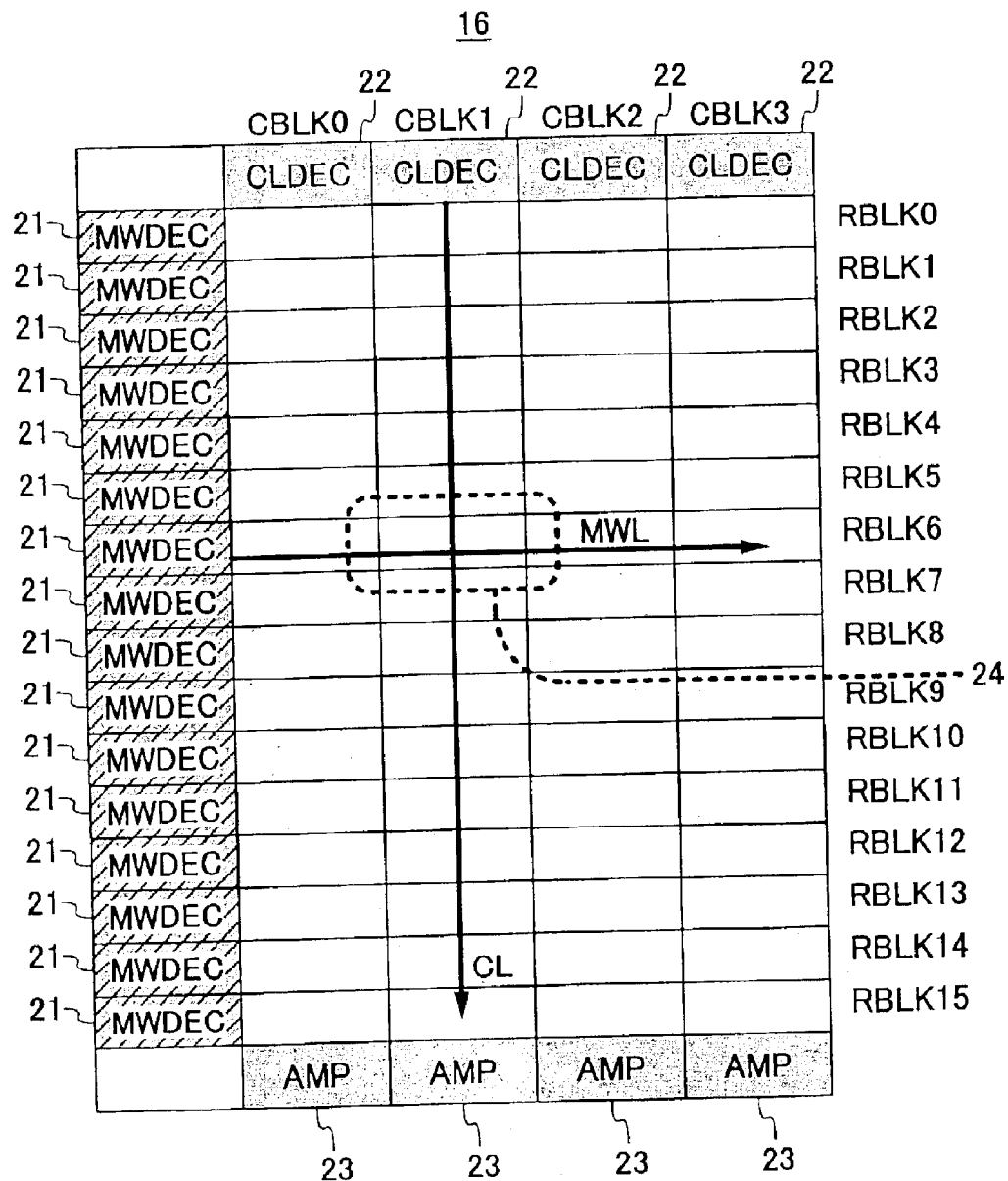
FIG. 2 is a schematic diagram showing the construction of a memory cell array according to an embodiment of the present invention.

FIG. 2 is a schematic diagram showing the construction of the cell array circuit 16 according to an embodiment.

The cell array circuit 16 is vertically and horizontally divided into memory blocks 24 by a plurality of column blocks CBLK0–CBLK3 extending vertically and a plurality of row blocks RBLK0–RBLK15 extending horizontally. Memory blocks in a column block share a column line CL (only one column line CL is showed in the schematic diagram). Memory blocks in a row block share a main word line MWL (only one main word line MWL is showed in the schematic diagram).

A main word decoder 21 is provided to each row block RBLK0–RBLK15 and selectively activates a main word line MWL corresponding to a designated row address by decoding the row address. A column decoder CLDEC is provided to each column block CBLK0–CBLK3 and selectively activates a column line CL corresponding to a designated column address by decoding the column address. An amp 23 is provided to each column block CBLK0–CBLK3 to amplify data read from a memory block and provide the amplified data to the I/O control circuit 13 or 14.

Figure 3:
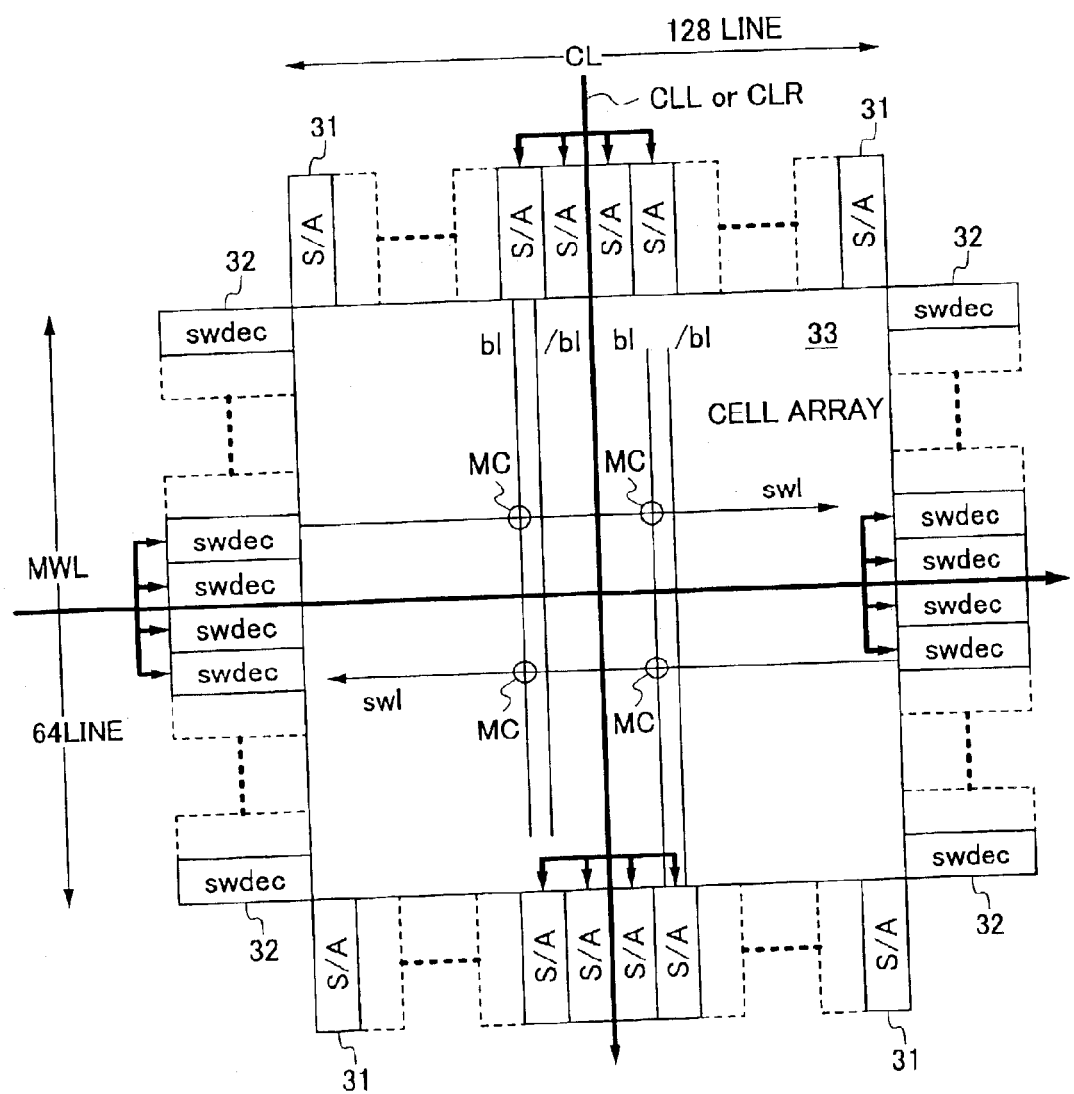
FIG. 3 is a schematic diagram showing the construction of a memory block according to an embodiment of the present invention.

FIG. 3 is a schematic diagram showing the construction of the memory block 24 according to an embodiment.

The memory block 24 of FIG. 3 is constructed by a plurality of sense amps (S/A) 31 and a plurality of sub-word decoders (swdec) 32 disposed around the cell array 33. For example, 128 column lines CL correspond to a memory block 24. The 128 column lines CL include 64 column lines $CL_L$ corresponding to an access through the left port and 64 column lines $CL_R$ corresponding to an access through the right port. Further, 64 main word lines MWL, for example, correspond to a memory block 24.

For example, 8 sub-word decoders 32 are connected to a main word line MWL. A sub-word line swl is extended over the cell array 33 from a sub-word decoder 32 and activates a gate of a cell transistor connected to each memory cell. A sub-word line swl is selectively activated by selectively activating a main word line MWL and further selectively driving a sub-word decoder 32. A DRAM memory cell MC connected to the activated sub-word line swl is connected to a bit line pair b1 and /b1.

As showed in FIG. 3, a column line CL ($CL_L$ or $CL_R$) is connected to eight sense amps 31, for example. The column line $CL_L$ is paired with a column line $CL_R$, and the column line $CL_R$ paired with the column line $CL_L$ is commonly connected to eight sense amps 31 to which the column line $CL_L$ is connected. Each sense amp 31 is connected to the bit line pair b1 and /b1, and amplifies voltage indicating data that are read through the bit lines b1 and /b1.

Figure 4:
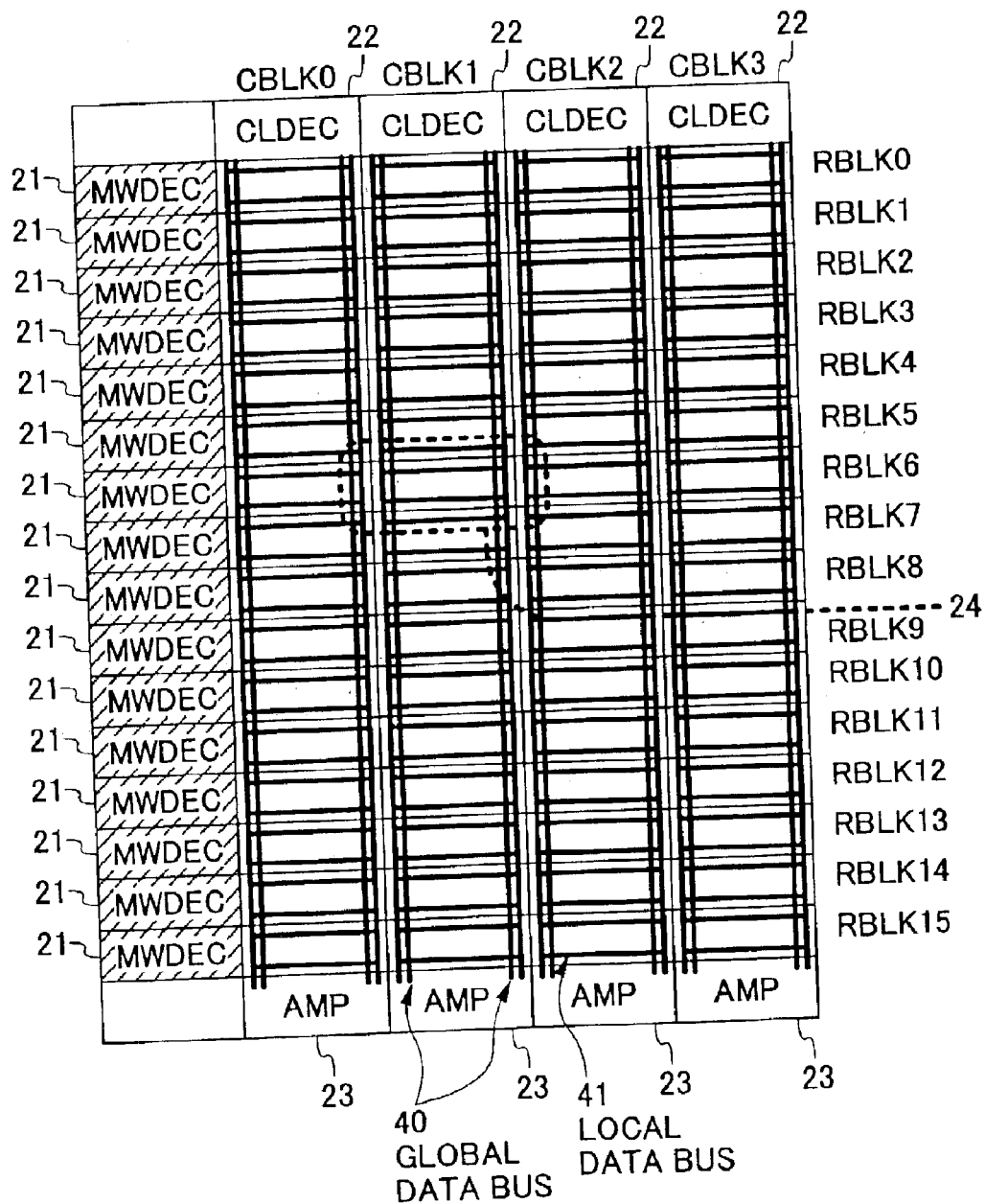
FIG. 4 is a schematic diagram showing the disposition of data busses in a memory cell array according to an embodiment of the present invention.

FIG. 4 is a schematic diagram showing the disposition of data buses in the cell array circuit 16 according to an embodiment. The same component as showed in FIG. 2 is referred to the same numeral, and its description is omitted.

As showed in FIG. 4, a global data bus 40 is provided at each side of each column block. A local data bus 41 is provided at each side of each memory block 24 in each row block. Each local data bus 41 is connected to the respective global data buses 40. When data are read from a memory block 24, the data are amplified by the sense amp 31 and transferred to the amp 23 through the local data bus 41 and the global data bus 40.

Two sets of the global data bus 40 and the local data bus 41 are provided to the dual-port memory according to an embodiment of the present invention for the left port and the right port, respectively.

Figure 5:
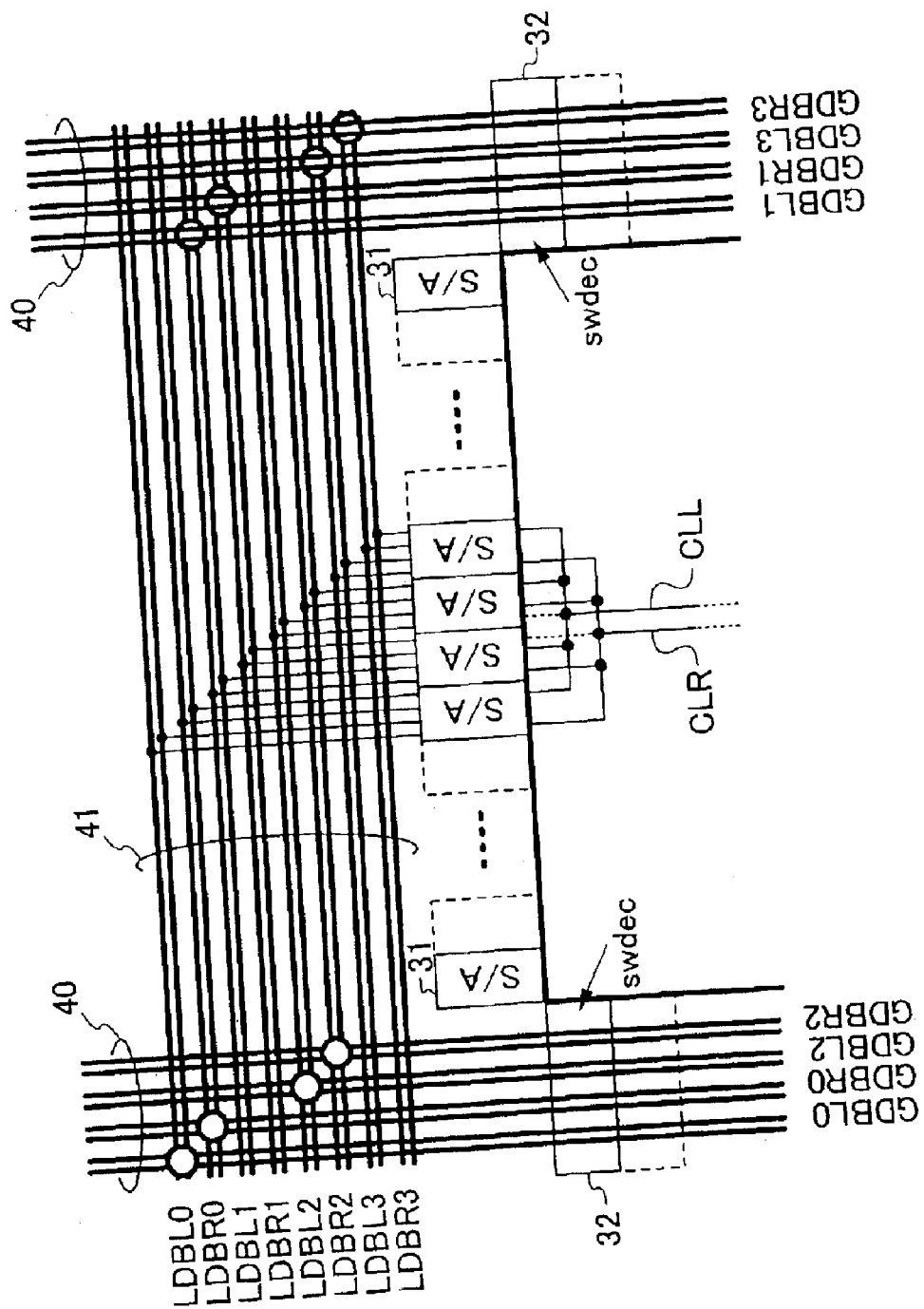
FIG. 5 is a schematic diagram showing the connection of sense amps, global data busses, and local data busses according to an embodiment of the present invention.

FIG. 5 is a schematic diagram showing the connection of the sense amps 31, the global data buses 40, and the local data buses 41.

As showed in FIG. 5, four sense amps 31 connected to the same $CL_R$ and $CL_L$ are connected to a set of 8 local data buses 41. That is, a sense amp 31 is connected to a pair of local data buses 41 corresponding to the right port and a pair of local data buses 41 corresponding to the left port. Particularly, $n^{th}$ one of the four sense amps 31 is connected to $n^{th}$ pair LDBLn of the local data buses 41 corresponding to the left port and to $n^{th}$ pair LDBRn of the local data buses 41 corresponding to the right port. Any set of four sense amps 31 connected to one of the 64 pairs of the column lines $CL_R$ and $CL_L$ are similarly connected to eight pairs of local data buses 41.

In a reading operation, four sense amps 31 selected by selectively activated column line $CL_R$ or $CL_L$ amplify data voltage of the corresponding bit lines and provide the data to the local data bus 41. The sense amps 31 arranged on top of and at the bottom of the cell array 33 are constructed so that either the sense amps 31 on top of the cell array 33 or the sense amps 31 at the bottom of the cell array 33 are activated depending on the state of connection of the memory cells, bit lines, and the sense amps 31. The data transferred from the sense amp 31 to the local data bus 41 are further transferred to the global data bus 40 through the local data bus 41. Then, the data on the global data bus 40 are further amplified by the amp 23 and output to the exterior of the cell array circuit 16.

In a writing operation, the flow of data is opposite. Data are provided from the amp 23 to the global data bus 40, and further transferred to the local data bus 41 through the global data bus 40. The sense amp 31 selected by either column line $CL_R$ or $CL_L$ receives the data on the local data bus 41 to write the data to a memory cell.

In these operations, one of the row blocks is selected, and one of the main word lines MWL corresponding to the row block is selectively activated. A column line $CL_R$ or $CL_L$ corresponding to a port is selectively activated in each column block. In the case of the construction in which four column blocks are provided as showed in FIGS. 2 and 4, since four sense amps 31 are connected to a column line $CL_R$ and $CL_L$, data of 16 bits can be input to or output from the entire cell array simultaneously through a port.

As described in FIG. 5, two sets of the global data bus 40 and the local data bus 41 are provided to the left port and the right port, respectively. Accordingly, the present invention enables an external device to access different row blocks in a column block through the left port and the right port by selectively activating a column line $CL_L$ for the left port and a column line $CL_R$ for the right port. For example, in a reading operation, data can be read from a row block to the global data bus 40 corresponding to the left port by selectively activating a column line $CL_L$. Data can be read simultaneously from another row block to the global data bus 40 corresponding to the right port by selectively activating a column line $CL_R$.

Figure 6:
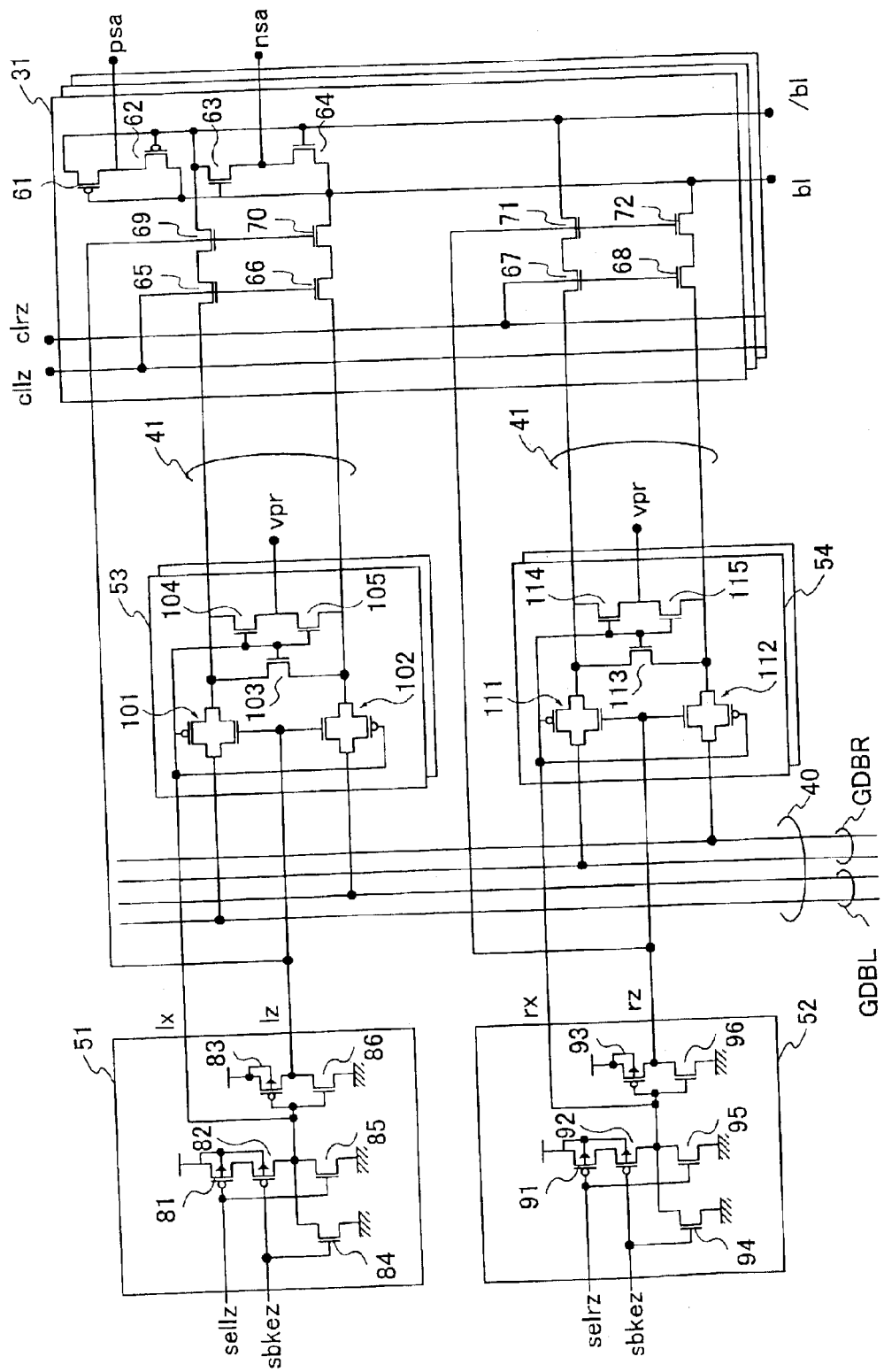
FIG. 6 is a schematic diagram showing the circuit connecting sense amps and global data busses through the local data busses according to an embodiment of the present invention.

FIG. 6 is a schematic diagram showing the circuit connecting the sense amp 31 and the global data bus 40 through the local data bus 41.

The circuit of FIG. 6 includes the following: a signal generation circuit 51 to connect the left port to the bus, a signal generation circuit 52 to connect the right port to the bus, a gate circuit 53 to connect the left port to the bus, a gate circuit 54 to connect the right port to the bus, and a sense amp 31. The sense amp 31 includes the following: a sense amp circuit constructed by PMOS transistors 61, 62, and NMOS transistors 63 and 64, and a column gate circuit constructed by NMOS transistors 65–72. When the sense amp drive signals psa and nsa are HIGH and LOW, respectively, the sense amp circuit amplifies the data voltage on the bit line pair bl and /bl.

The signal generation circuit 51 to connect the left port to the bus receives a signal sellz that turns to HIGH in response to an access request from the left port and a row block activation signal sbkez that turns HIGH in response to an activation of the corresponding row block. The signal generation circuit 51 includes PMOS transistors 81–83 and NMOS transistors 84–86 and, when both the signal sellz and the row block activation signal sbkez are turned HIGH, turns the bus control signal lx and lz to LOW and HIGH, respectively. The signal sellz is a signal the timing control arbiter 15 of FIG. 1 asserts in response to the access request through the left port.

Likewise, the signal generation circuit 52 receives a signal selrz that is turned to HIGH in response to an access request from the right port and a row block activation signal sbkez that is turned to HIGH in response to an activation of the corresponding row block. The signal generation circuit 52 includes PMOS transistors 91–93 and NMOS transistors 94–96 and, when both the signal selrz and the row block activation signal sbkez are HIGH, turns the bus connection signals rx and rz to LOW and HIGH, respectively. The signal selrz is a signal that the timing control arbiter 15 asserts in response to the access request through the right port.

The gate circuit 53 includes transfer gates 101 and 102 further including a PMOS transistor and a NMOS transistor connected in parallel, and NMOS transistors 103–105. The NMOS transistors 103–105 connect the local data bus 41 to a pre-charge voltage vpr when the signal lx is HIGH, and connect lines of a local data bus 41 to each other to equalize them to the same voltage.

When the bus connection signals lx and lz from the signal generation circuit 51 are turned from LOW to HIGH, the transfer gates 101 and 102 become conductive and connect the global-data bus 40 and the local data bus 41. In response to a HIGH signal of the bus connection signal lz, the NMOS transistors 69 and 70 in the sense amp 31 become conductive. Accordingly, in the case where the column line cllz corresponding to the left port is HIGH, column gate NMOS transistors 65 and 66 become conductive, and the bit lines bl and /bl are connected to the local data bus 41. Consequently, data amplified by the sense amp are provided to the bus GDBL of the global data bus 40 corresponding to the left port via the local data bus 41.

The bus connection gate circuit 54 includes the following: transfer gates 111 and 112 consisting of PMOS transistors and NMOS transistors connected in parallel, and NMOS transistors 113–115. When the signal rx is HIGH, the NMOS transistors 113–115 connect the local data bus 41 to the pre-charge voltage vpr and further connect lines of the local data bus 41 to each other to equalize them at the same voltage.

When the bus connection signals rx and rz from the bus connection signal generation circuit 52 are turned to LOW and HIGH, respectively, the transfer gates 111 and 112 become conductive, and connect the global data bus 40 and the local data bus 41. In the sense amp 31, the NMOS transistors 71 and 72 become conductive in response to a HIGH signal on the bus connection signal rz. Accordingly, in the case where the column line clr corresponding to the right port is HIGH, the column gate NMOS transistors 67 and 68 become conductive and connect the bit lines bl and /bl to the local data bus 41. Consequently, data amplified by the sense amp are provided to the bus GDBR of the global data bus 40 corresponding to the right port via the local data bus 41.

As described above, when a corresponding row block is selectively activated, and a corresponding column line is selectively activated by an access via the left port, the sense amp 31 is connected to the global data bus GDBL corresponding to the left port. When a corresponding row block is selectively activated, and a corresponding column line is selectively activated by an access via the right port, the sense amp 31 is connected to the global data bus GDBR corresponding to the right port. As showed in FIGS. 4 and 5, the global data buses 40 are independently provided to each port, left and right, in each column block. Accordingly, it is possible to read data from a memory block corresponding to a first row block of a column block to the global data bus for the left port and at the same time, to read data from a memory block corresponding to a second row block of the same column block to the global data bus for the right port.

The NMOS transistors 69–72 of the sense amp 31 are provided so that the local data bus 41 is not connected to the bit lines bl and /bl in row blocks other than the row block that is accessed. If these transistors are not provided, the local data bus 41 is connected to the bit lines bl and /bl in row blocks that are not accessed, and data on the bit lines bl and /bl may be affected by the pre-charge voltage of the local data bus 41.

The present invention is not limited to these embodiments, but various variations and modifications may be made without departing from the scope of the present invention.

This patent application is based on Japanese priority patent application No. 2002-110275 filed on Apr. 12, 2002, the entire contents of which are hereby incorporated by reference.

What is claimed is:

1. A semiconductor memory apparatus, comprising:
   a first I/O port and a second I/O port;
   a cell array circuit divided into a plurality of column blocks and a plurality of row blocks;
   a first column line and a second column line corresponding to said first I/O port and said second I/O port, respectively;
   a first global data bus and a second global data bus corresponding to said first I/O port and said second I/O port, respectively, said first global data bus and said second global data bus being provided to each one of the plurality of column blocks;

a first bus connection gate circuit that connects a sense amp of one of the plurality of row blocks selected in response to an access through said first I/O port, said sense amp being selected by said first column line, to said first global data bus; and a second bus connection gate circuit that connects a sense amp of one of the plurality of row blocks selected in response to an access through said second I/O port, said sense amp being selected by said second column line, to said second global data bus.

2. The semiconductor memory apparatus as claimed in claim 1, further comprising:

a first column gate and a second column gate corresponding to said first column line and said second column line, respectively, and said first column gate and said second column gate becoming conductive in response to an activation of the corresponding column line; and a first local data bus and a second local data bus correspondingly to said first I/O port and said second I/O port, respectively, said first local data bus and said second local data bus being connected to each sense amp through said first column gate and said second column gate, respectively;

wherein said first local data bus is connected to said first global data bus through said first bus connection gate circuit; and said second local data bus is connected to said second global data bus through said second bus connection gate circuit.

3. The semiconductor memory apparatus as claimed in claim 2, further comprising:

a first bus connection signal generation circuit provided in a row block selected in response to an access through said first I/O port, said first bus connection signal generation circuit asserting a first bus connection signal; and a second bus connection signal generation circuit provided in a row block selected in response to an access through said second I/O port, said second bus connection signal generation circuit asserting a second bus connection signal;

wherein said first bus connection gate circuit becomes conductive depending on an asserted state of said first bus connection signal; and said second bus connection gate circuit becomes conductive depending on an asserted state of said second bus connection signal.

4. The semiconductor memory apparatus as claimed in claim 3, further comprising:

a first transistor provided between said first local data bus and each sense amp in series to said first column gate; and a second transistor provided between said second local data bus and each sense amp in series to said second column gate;

wherein said first transistor becomes conductive in response to an asserted state of said first bus connection signal; and said second transistor becomes conductive in response to an asserted state of said second bus connection signal.

5. A semiconductor memory apparatus, comprising:

a first I/O port and a second I/O port;

a sense amp amplifying a data voltage on a bit line;

a first column line and a second column line corresponding to said first I/O port and said second I/O port, respectively;

a first column gate and a second column gate correspondingly provided to said first column line and said second column line, respectively, said first column gate and said second column gate becoming conductive in response to an activation of the corresponding column line;

a first local data bus and a second local data bus corresponding to said first I/O port and said second I/O port, respectively, said first local data bus and said second local data bus being connected to said sense amp via said first column gate and said second column gate, respectively;

a first global data bus and a second global data bus corresponding to said first I/O port and said second I/O port, respectively;

a first bus connection gate circuit connecting said first local data bus to said first global data bus; and a second bus connection gate circuit connecting said second local data bus to said second global data bus.

6. The semiconductor memory apparatus as claimed in claim 5, wherein said first bus connection gate circuit connects said first local data bus to said first global data bus in a row block selected in response to an access via said first I/O port; and said second bus connection gate circuit connects said second local data bus to said second global data bus in a row block selected in response to an access via said second I/O port.

7. The semiconductor memory apparatus as claimed in claim 6, further comprising:

a first transistor provided between said first local data bus and said sense amp in series to said first column gate; and a second transistor provided between said second local data bus and said sense amp in series to said second column gate;

wherein said first transistor in a row block selected in response to an access via said first I/O port becomes conductive; and said second transistor in a row block selected in response to an access via said second I/O port becomes conductive.

* * * * *